(12) United States Patent
Lo et al.

(10) Patent No.: US 7,474,157 B2
(45) Date of Patent: Jan. 6, 2009

(54) POWER AMPLIFIER

(75) Inventors: Atron Lo, Mississauga (CA); Jeliazko Stoyanov Batchvarov, Etobicoke (CA)

(73) Assignee: Sonavox Canada Inc., Markham (CA)

( * ) Notice: Subject to any disclaimer, the term of this patent is extended or adjusted under 35 U.S.C. 154(b) by 100 days.

(21) Appl. No.: 11/482,020

(22) Filed: Jul. 7, 2006

(65) Prior Publication Data

US 2008/0007342 A1    Jan. 10, 2008

(51) Int. Cl.
*H03F 3/04*    (2006.01)
(52) U.S. Cl. .................. 330/297; 330/127; 330/129
(58) Field of Classification Search .............. 330/127, 330/129, 285, 297
See application file for complete search history.

(56) References Cited

U.S. PATENT DOCUMENTS

| | | | |
|---|---|---|---|
| 3,772,606 A | 11/1973 | Waehner | |
| 4,430,625 A | 2/1984 | Yokoyama | |
| 5,075,634 A | 12/1991 | French | |
| 5,347,230 A | 9/1994 | Noro | |
| 5,479,134 A * | 12/1995 | Nishioka et al. | 330/297 |
| 5,510,753 A | 4/1996 | French | |
| 5,909,145 A * | 6/1999 | Zimmerman | 330/297 |
| 6,160,455 A * | 12/2000 | French et al. | 330/297 |
| 6,825,726 B2 | 11/2004 | French et al. | |

* cited by examiner

*Primary Examiner*—Khanh V Nguyen
(74) *Attorney, Agent, or Firm*—Bereskin & Parr

(57) ABSTRACT

A power amplifier is described that includes an amplification circuit and a linear regulator. The amplification circuit amplifies an input signal to produce an output signal and provides a feedback signal for tracking the expected power requirements of the output signal. The linear regulator is connectable for receiving as inputs the feedback signal from the amplification circuit and a plurality of fixed voltage supply rails. The linear regulator provides as an output at least one voltage supply to the amplification circuit. In at least one mode of operation, the at least one voltage supply provided to the amplification circuit tracks the expected output requirements of the amplification circuit between two of the plurality of fixed voltage supply rails.

19 Claims, 8 Drawing Sheets

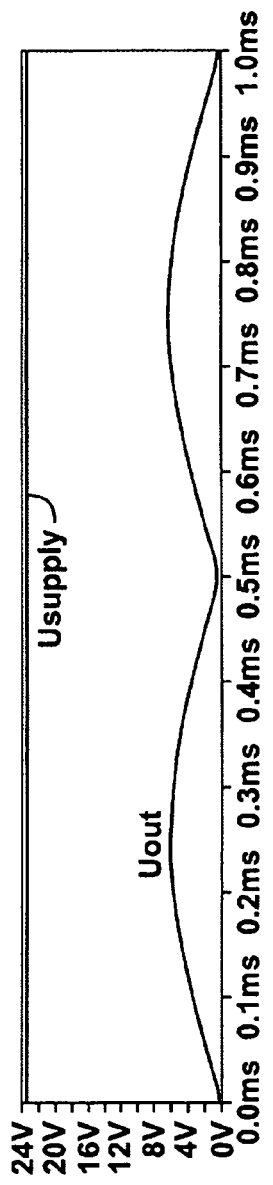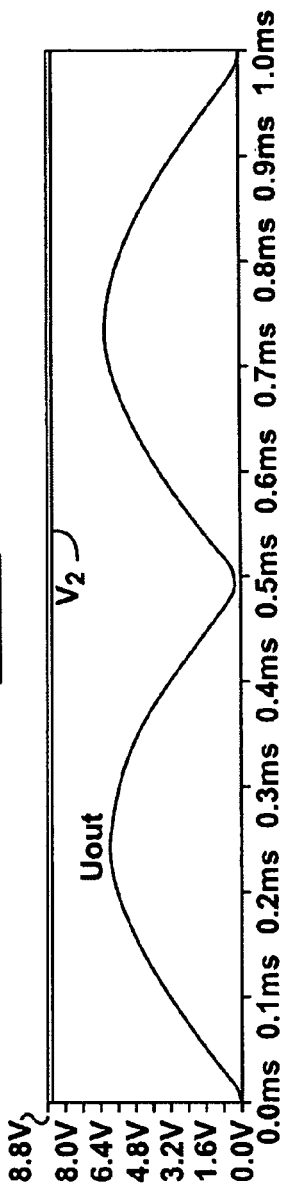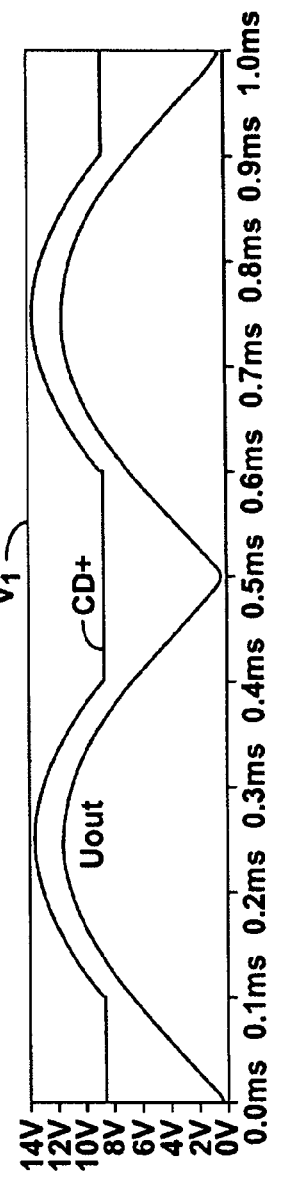

POWER AMPLIFIER

FIELD OF THE INVENTION

The present invention relates to power amplifiers, and more specifically to low power linear power amplifiers.

BACKGROUND OF THE INVENTION

Audio signals typically have a large dynamic range. For example, audio signals often have a peak-to-average magnitude ratio of 8-to-1 or even higher, which means that the average value of an audio signal is much smaller than possible peak values. However, the peaks in an audio signal are relatively infrequent and at most times an audio signal has a magnitude close to a relatively low average magnitude.

A power amplifier for amplifying an audio signal must be capable of producing an output signal with corresponding high peaks while most often producing an output audio signal with a comparatively low magnitude. Typically for a power amplifier, the DC bias current required to maintain the necessary operating range within the active amplifying devices to produce peak output power is significantly higher than the DC bias current required to amplify the audio signal at or close to the relatively low average level. Thus, given that peaks in an audio signal are infrequent, the bias current will be higher than required most of the time which in turn leads to low efficiency if peak power is always made available, such as in a typical class AB amplifier. In contrast it would be preferable if the available output power could be adjusted to track the requirements of the input signal. Those skilled in the art will appreciate that headroom is defined as the difference between the supplied power and that of the output audio signal.

SUMMARY OF THE INVENTION

In a first aspect, at least embodiment described herein provides a power amplifier comprising an amplification circuit for amplifying an input signal to produce an output signal and providing a feedback signal for tracking the expected power requirements of the output signal; and a linear regulator, connectable for receiving as inputs the feedback signal from the amplification circuit and a plurality of fixed voltage supply rails and providing as an output at least one voltage supply to the amplification circuit, wherein in at least one mode of operation the at least one voltage supply provided to the amplification circuit tracks the expected output requirements of the amplification circuit between two of the plurality of fixed voltage supply rails.

The power amplifier may further comprise a multi-level power supply for providing a plurality of fixed voltage supply rails to the linear regulator.

The linear regulator may comprise positive and negative voltage rails; a voltage divider across the positive and negative voltage rails including two resistors R1 and R2 connected at a ground potential; a linear control circuit for tracking the expected output requirements of the amplification circuit between two of the plurality of fixed voltage supply rails; and a coupler connected between the linear control circuit and the voltage divider for selectively coupling the linear control circuit to the voltage divider.

The coupler may include the combination of a transistor and a diode connected between the linear control circuit and the voltage divider, with the anode of the diode connected to the voltage divider.

In a first mode of operation the coupler may be configured to operate as an open circuit, and in a second mode of operation the coupler can be configured to operate as a tunable resistor.

The positive voltage rail may be connectable directly to a terminal of a multi-level power supply that provides at least some of the plurality of fixed voltage supply rails.

The linear control circuit may be connectable to receive as inputs the feedback signal from the amplification circuit and the level of the at least one voltage supply provided by the linear regulator to the amplification circuit.

The linear control circuit may comprises a transistor connectable to the voltage divider of the linear regulator; an offset stage for prebiasing the transistor to an on state without the transistor being coupled to the voltage divider; and a comparator for summing respective currents derived from the feedback signal and the level of the at least one voltage supply rail of the amplification circuit and comparing the respective voltages of each and adjusting the bias on the transistor in response to fluctuations in the feedback signal and the level of the at least one voltage supply rail.

The comparator may be configured to bias the transistor to provide additional supply voltage to the amplification circuit when the expected power requirements for the output signal is above the magnitude of a first voltage supply rail and below the magnitude of a second voltage supply rail.

The comparator may be configured to bias the transistor to not provide additional supply voltage to the amplification circuit when the expected power requirements for the output signal is below the magnitude of the first voltage supply rail.

The linear control circuit may further comprise a first current converter connected to the comparator, the first current converter being configured to receive the feedback signal and providing a corresponding first current signal to the comparator; a second current converter connected to the comparator, the second current converter being configured to receive one of the at least one voltage supply rail from the amplification circuit and providing a corresponding second current signal to the comparator, and a drive stage connected to the comparator and the transistor, the drive stage being configured to receive the output of the comparator to bias the transistor.

The linear control circuit may further comprise a voltage clamp connected between the output of the drive stage and the input of the transistor, the voltage clamp being configured to limit the amount of bias of the transistor.

The power supply may comprise a transformer including primary and secondary windings; a control circuit coupled to respective points on both the primary and secondary windings, the control circuit being operable to maintain a fixed voltage level on the primary winding irrespective of voltage level changes on the secondary winding; and a snubber circuit connected to the primary winding of the transformer, the snubber circuit including a combination of first and second diodes, a capacitor and a resistor, wherein the first diode and the capacitor are connected in series across the primary winding, with the capacitor connected to one end of the primary winding, and one end of the resister is connected at a node connecting the diode and the capacitor in series, and the second diode is connected between the other end of the resistor and ground, wherein the discharge path of the capacitor is through the resistor to ground.

The power supply may further comprise a transistor connected between the control circuit and the one end of the primary winding connected to the capacitor.

The power supply may further be arranged in a flyback configuration.

The power supply may further comprise a second capacitor and a third diode connected in series between a first terminal of the secondary winding and a center tap of the secondary winding with the cathode of the third diode being connected to the center tap; a third capacitor and a fourth diode connected in series between the first terminal of the secondary winding and a second terminal of the secondary winding with the cathode of the fourth diode being connected to the second terminal; and a fifth diode having a cathode connected to the anode of the third diode, wherein the power supply provides a first voltage supply rail connectable to the first terminal of the secondary winding, and a second voltage supply rail connectable at the anode of the fifth diode.

In another aspect, at least one embodiment described herein provides a method of adjusting supply voltages provided to an amplification circuit of a power amplifier based on a plurality of fixed supply voltage rails, wherein the method comprises:

generating a feedback signal indicative of the expected power requirements of an output signal produced by the power amplifier;

comparing the feedback signal to at least one of the plurality of fixed supply voltage rails; and adjusting the supply voltages to track the expected power requirements of the output signal in a first mode of operation when the expected power requirements of the output signal is between two of the plurality of fixed supply voltage rails.

The method may further comprise generating the supply voltages to be at the level of the lower of the two of the plurality of fixed supply voltage rails in a second mode of operation when the expected power requirements of the output signal is less than the lower of the two of the plurality of fixed supply voltage rails.

In another aspect, at least one embodiment described herein provides a power amplifier comprising an amplification circuit for amplifying an input signal to produce an output signal and providing a feedback signal for tracking the expected power requirements of the output signal; means for comparing the feedback signal to at least one of a plurality of fixed supply voltage rails; and means for adjusting supply voltages provided to the amplification circuit to track the expected power requirements of the output signal in a first mode of operation when the expected power requirements of the output signal is between two of the plurality of fixed supply voltage rails.

BRIEF DESCRIPTION OF THE DRAWINGS

For a better understanding of the present invention, and to show more clearly how it may be carried into effect, reference will now be made, by way of example, to the accompanying drawings, which illustrate aspects of embodiments of the present invention and in which:

FIG. 5A is a voltage diagram showing the headroom between a single fixed supply rail and an example of the output voltage of a prior art Class AB power amplifier;

FIG. 5B is a voltage diagram showing the headroom between a low supply rail and an example of an average output voltage for the first equivalent circuit shown in FIG. 2C; and FIG. 5C is a voltage diagram showing the headroom between a high variable supply rail and an example of a high output voltage for the second equivalent circuit shown in FIG. 2D.

DETAILED DESCRIPTION OF EMBODIMENTS OF THE INVENTION

Figure 1:
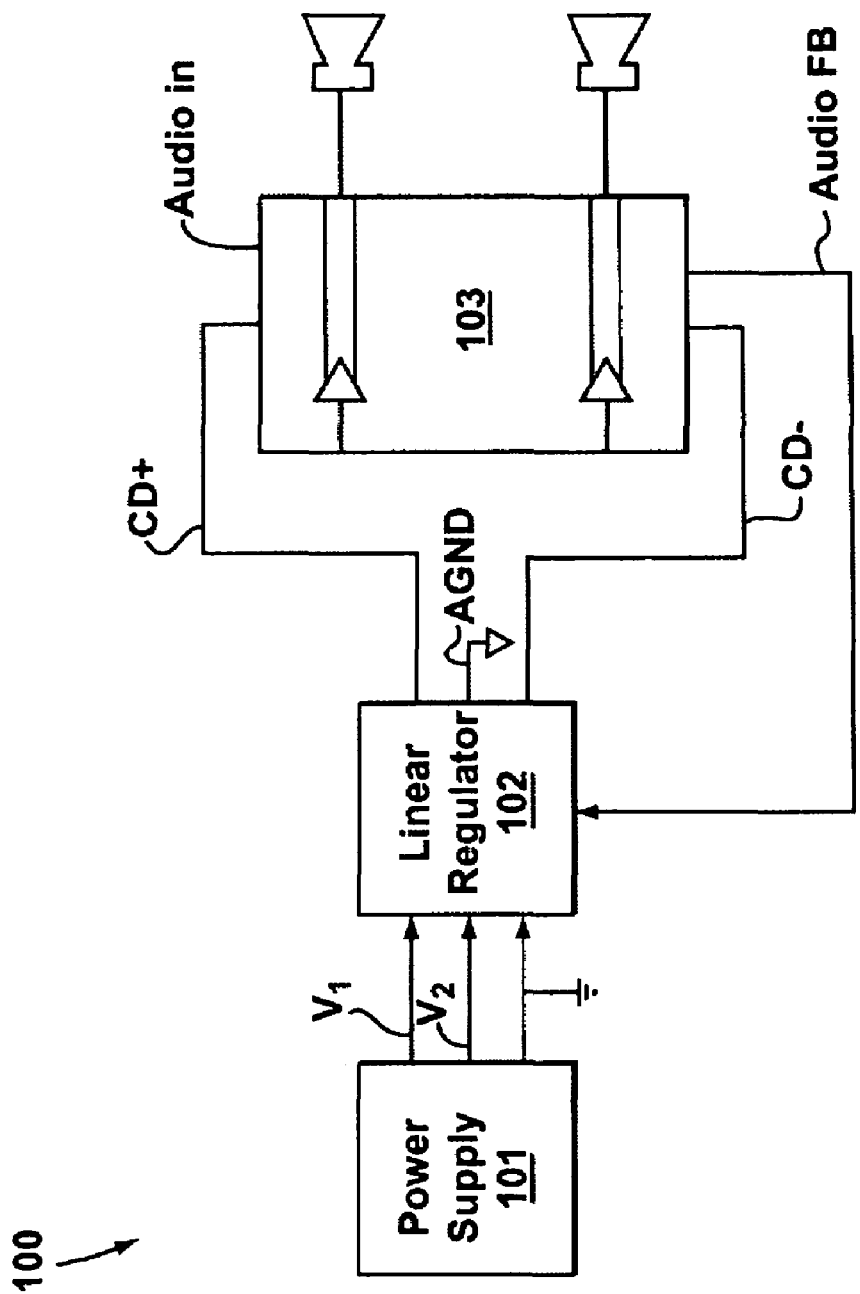
FIG. 1 is a simplified schematic drawing of a power amplifier according to an embodiment of the invention.

A number of power amplifiers are known which vary the power supplied to the power amplifier's main amplification circuit (or amplifier) so that the amount of headroom between the supplied power and the magnitude of the power amplifier's output audio signal is reduced. However, previous designs have a number of shortcomings that make them inefficient, susceptible to Electromagnetic Interference (EMI) and poorly suited for low power linear operation. Accordingly, there is a need for an efficient low power linear power amplifier with low EMI emissions and with reduced headroom between the power supplied to the amplification circuit and the amplified output signal of the power amplifier. It is preferable for the power amplifier to have a tracking stage or sub-circuit that allows the headroom to be reduced while ensuring that sufficient power is provided to the amplification circuit. The headroom can be reduced by tracking the power requirements of the output signal, and adjusting the supply voltage accordingly, for certain circumstances. Alternatively, for very low power requirements, a first supply voltage can be provided, and for larger power requirements above the first supply voltage, a variable supply voltage can be provided that tracks the power requirements of the output audio signal. Moreover, this tracking can be done in a linear fashion for reduced or more optimized power dissipation, as is explained in further detail below. In addition, this tracking can be done up to another supply voltage level.

To that end, provided in accordance with some embodiments of the present invention is a relatively efficient low power linear power amplifier. More specifically, a power amplifier provided in accordance with some embodiments of the invention includes a multi-level power supply suitable for low power applications, a linear regulator for automatically sensing and tracking output power needs between at least two power rails and selectively switching between power rails.

Some embodiments of the power amplifier may be advantageously implemented with a low component count, which may in turn reduce cost. Some embodiments of the power amplifier may enable a better distribution of heat by allowing heat to be dissipated in a combination of the linear regulator and the amplification circuit, as opposed to simply in the amplification circuit as in class AB amplifiers. Improved heat distribution helps thermal management and may prevent shutdown of the amplification circuit resulting from overheating. The heat distribution is a result of the linear regulator providing the additional supply voltage when the power requirements of the output signal are above a voltage threshold (i.e. a first supply voltage level).

In some embodiments of the invention, the power amplifier provided includes a power supply with a modified flyback converter configuration including a novel low power snubber circuit. In some embodiments, the snubber circuit has a low component count and is effective enough that it can be used alone without the need for additional snubber circuits to dampen EMI within the power supply circuit. The power dissipation of a typical RCD snubber circuit, (R and C in series and a diode in parallel with the R) is dependent on ac line voltage and voltage across the primary transformer winding. By contrast, for a RCD2 snubber circuit provided in accordance with aspects of the present invention, the power loss is only dependent on the voltage across the primary transformer winding.

Referring to FIG. 1, shown is a simplified schematic drawing of a power amplifier 100 according to an embodiment of the invention. The power amplifier 100 has a power supply 101, a linear regulator 102 and an amplifier circuit 103.

In this very specific embodiment, the power supply 101 provides voltage rails $V_1$ and $V_2$ and a common ground connection to the linear regulator 102. Additionally and/or alternatively, in other embodiments the power supply 101 can be adapted to supply an arbitrary number of voltage rails to the linear regulator 102. A description of a very specific configuration of the power supply 101 is provided further below with reference to FIG. 4.

The linear regulator 102 is coupled to receive the two voltage rails $V_1$ and $V_2$ and the common ground connection from the power supply 101 and an audio feedback signal from the amplifier circuit 103. As outputs, the linear regulator 102 provides respective positive and negative voltage rails CD+ and CD− to the amplifier circuit 103.

Briefly, in operation, the respective positive and negative voltage rails CD+ and CD− are level-controlled by the linear regulator 102 so that sufficient power is provided to the amplifier circuit 103 permitting the input audio signal (Audio in) to be amplified without significant distortion, whilst reducing the headroom between the supply power and the desired output power of the amplified audio signal. The level-control occurs as a result of the audio feedback signal (Audio FB), which allows real-time tracking of the power needed to produce a relatively undistorted and amplified audio output signal from the amplifier circuit 103. The respective positive and negative voltage rails CD+ and CD− are derived by the linear regulator 102 from the voltage rails $V_1$ and $V_2$ and the common ground connection supplied by the power supply 101. In at least one mode of operation, the linear regulator controls CD+ and CD− to track the expected output of the amplification circuit between the voltage rails $V_1$ and $V_2$. A more detailed description of the operation of the power amplifier 100 is described below with reference to the remaining figures.

Figure 2A:
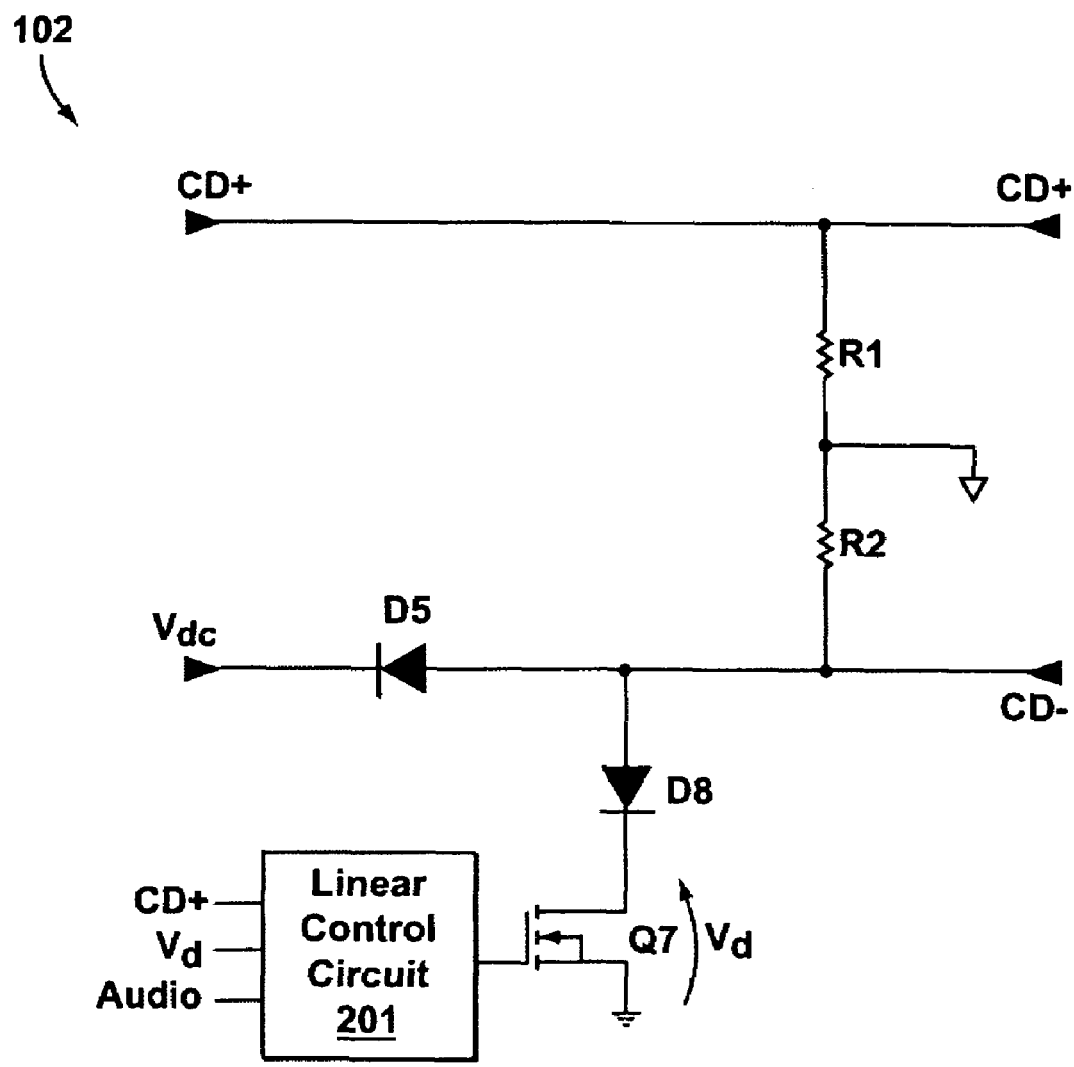
FIG. 2A is a simplified schematic drawing of a linear regulator shown in FIG. 1 and in accordance with an embodiment of the invention.

Turning to FIG. 2A, and with continued reference to FIG. 1, shown is a simplified schematic drawing of the linear regulator 102 shown in FIG. 1 and in accordance with an embodiment of the invention. The linear regulator 102 includes a linear control circuit 201, which is described in greater detail below with reference to FIG. 3. Briefly, the linear control circuit 201 is arranged to receive feedback signals and provide a signal that controls the output of the linear regulator 102. Specifically, as noted above, the linear control circuit 201 is coupled to receive feedback from the voltage rails CD+, CD− and the audio signal feedback provided by the amplifier circuit 103.

The linear regulator 102 also includes a voltage divider formed by resistors R1 and R2 that separate voltage rails CD+ and CD− and connect together at a ground potential. A coupler is also provided including a transistor Q7 and a diode D8. The transistor Q7 is connected between the linear control circuit 201 and the voltage rail CD−, thereby coupling the linear control circuit 201 to the voltage divider. Additionally and/or alternatively, the transistor Q7 may be replaced with another suitable switching/tracking device for coupling the linear control circuit 201 to the voltage rail CD−. The diode D8 is also provided between the transistor Q7 and voltage rail CD− to increase the response time for increasing the voltage at node CD+ when a large supply voltage is required, as well as promptly returning to a lower supply voltage when required. Accordingly, without the diode D8, the voltage on CD+ cannot rise fast enough to track large voltage swings. Another diode D5 is provided along CD− to isolate the transistor Q7 and the feedback point from the CD− so that Q7 can be continuously operated at a preset standby voltage.

Figure 2B:
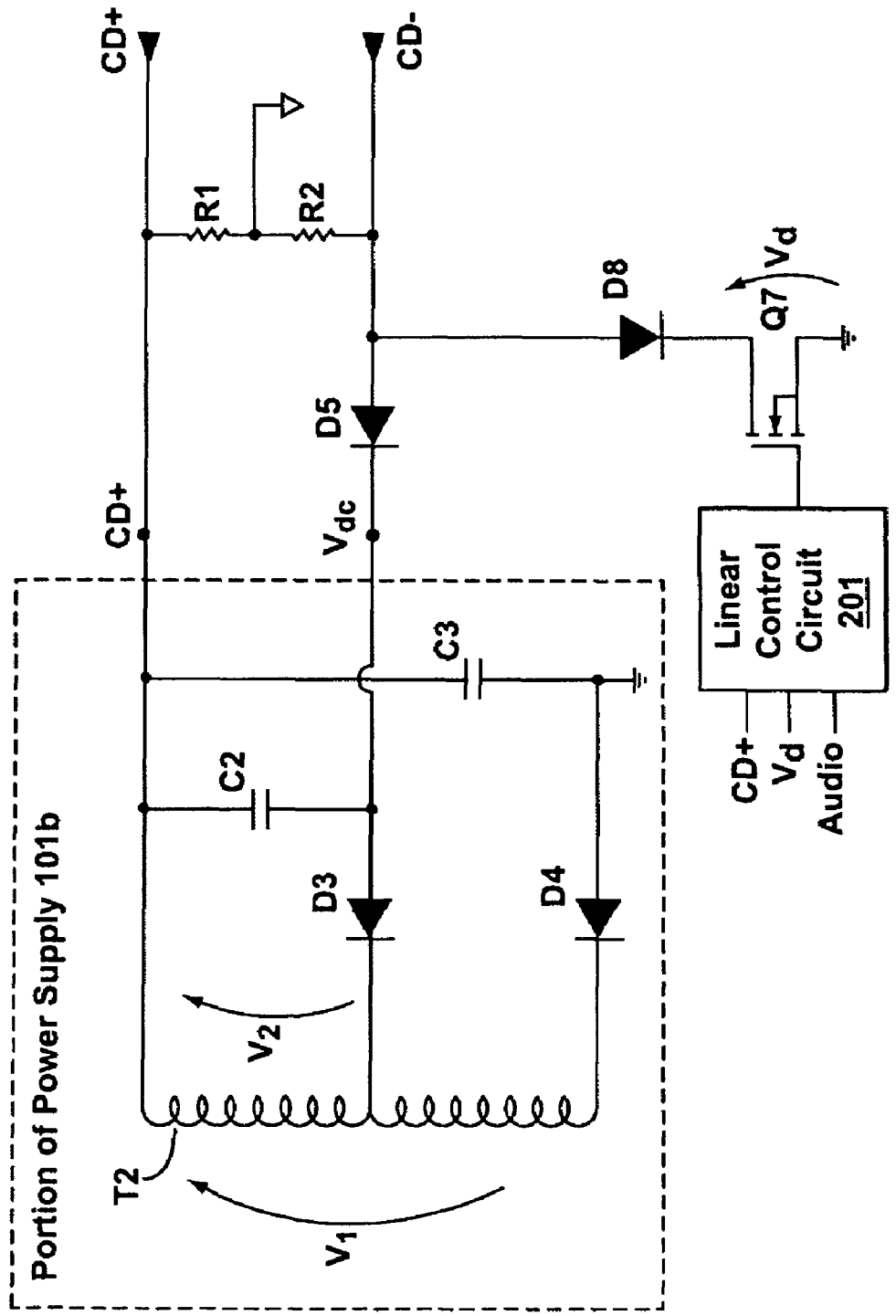
FIG. 2B is the simplified schematic drawing of the linear regulator shown in FIG. 2A with a portion of a power supply.

Turning to FIG. 2B, and with continued reference to FIGS. 2A and 1, the linear regulator 102 is shown in combination with a portion of a power supply circuit 101b. The portion of the power supply circuit 101b includes a tapped transformer winding T2. The center tap is coupled across the voltage rails CD+ and CD− and a parallel capacitor C2 is also included across the voltage rails CD+ and CD−. A diode D3 is connected between one end of the capacitor C2 and the center tap of the transformer winding T2. The end terminals of the transformer winding T2 are connected across the voltage rail CD+ and ground, and a parallel capacitor C3 is included across the end terminals of the transformer winding T2. A diode D4 is connected in series between one end of the transformer winding T2 and the ground connection.

Figure 2C:
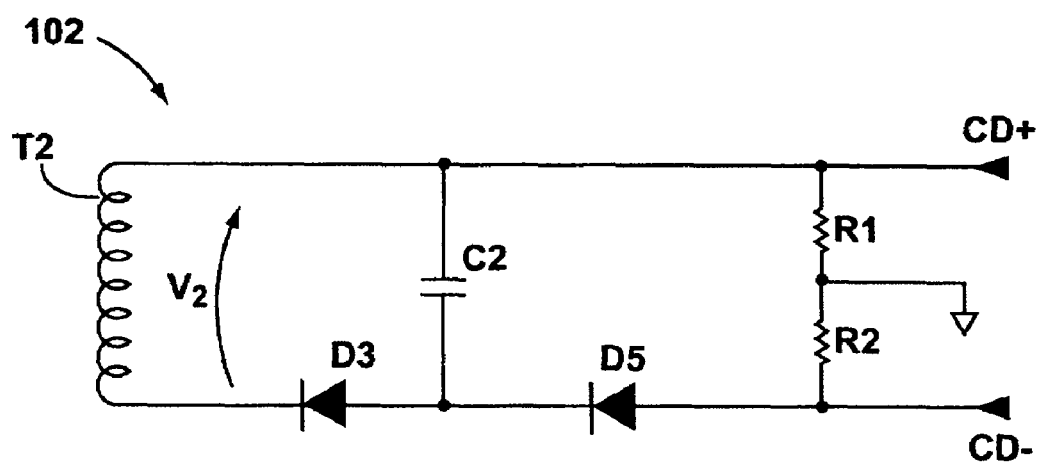
FIG. 2C is a simplified schematic drawing of a first equivalent circuit of the linear regulator of FIG. 2B in a first mode of operation.
Figure 2C:
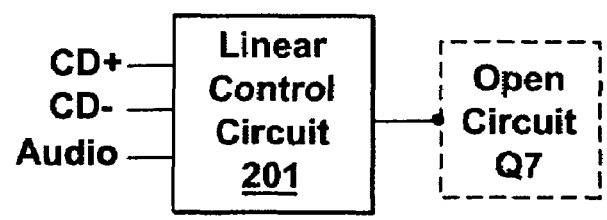
Figure 2D:
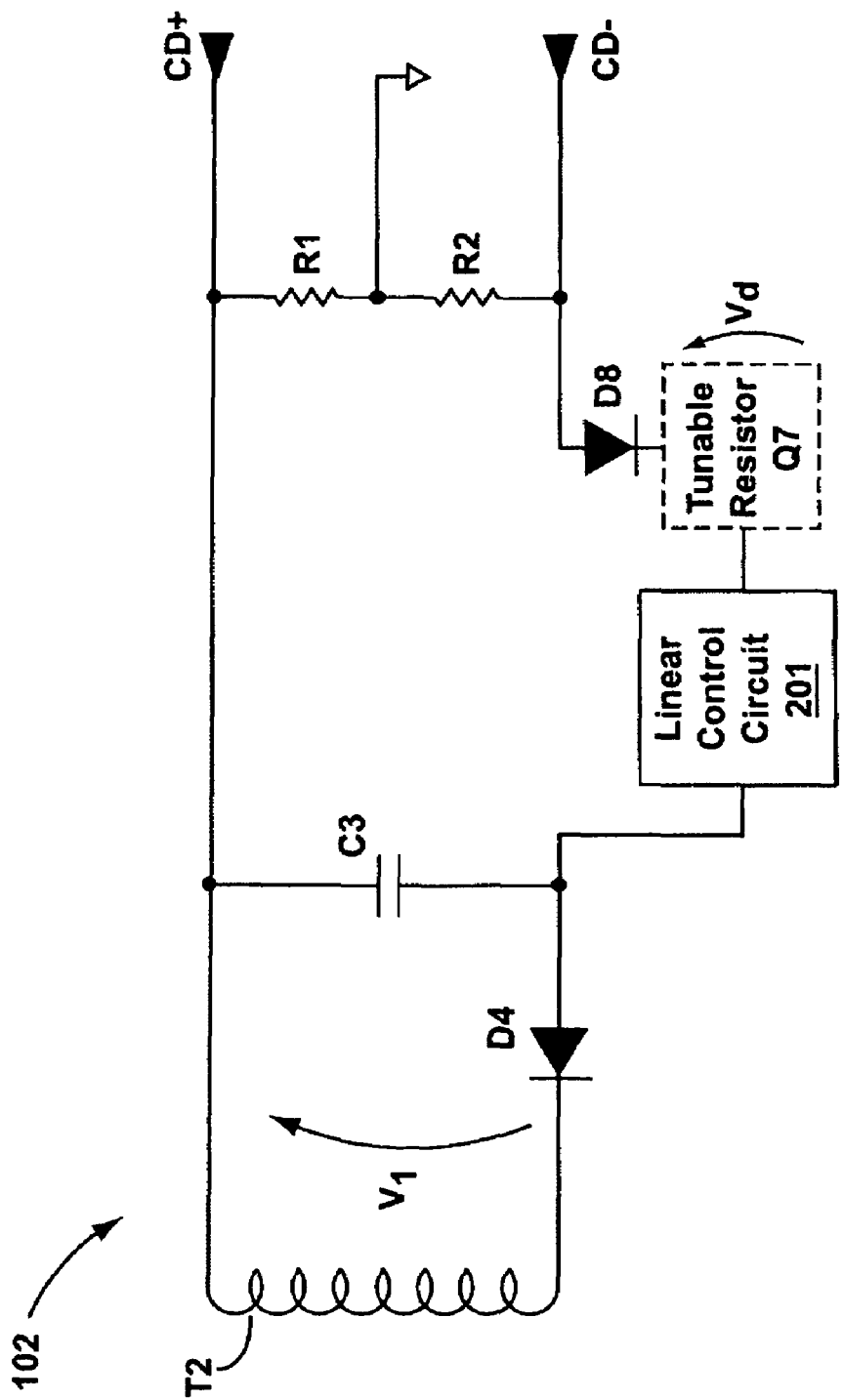
FIG. 2D is a simplified schematic drawing of a second equivalent circuit of the linear regulator of FIG. 2B in a second mode of operation.

In operation the voltage across voltage rails CD+ and CD− is either $V_2$ or some portion of $V_1$ depending upon the state of the transistor switch Q7. When the transistor Q7 is biased to a drain voltage level (referenced to CD+) that is lower than $V_2$, the voltage across the diode D8 is not sufficient to cause the diode D8 to conduct. As a result, there is effectively an open circuit that in turn separates the linear control circuit 201 from the voltage divider. The equivalent circuit of this scenario is shown in FIG. 2C. The operational result is that, the voltage across the rails CD+ and CD− is $V_2$. On the other hand, when the transistor Q7 is on, the transistor Q7 is effectively a tunable resistor connecting the voltage divider to the linear control circuit 201. The equivalent circuit of this scenario is shown in FIG. 2D. When the linear control circuit 201 is coupled to the voltage divider the voltage across CD+ and CD− is controlled to track the expected requirements for an amplified audio signal up to a maximum rail-to-rail voltage of $V_1$. The implementation and operation of the linear control circuit 201 that enables the tracking of the amplified audio signal, in accordance with one very specific embodiment of the invention, is described further below with reference to FIG. 3.

Before looking at the linear control circuit 201 in more detail it is useful to first compare the example operational voltage levels of a power amplifier provided in accordance with aspects of the present invention with those of a typical prior art class AB amplifier. To that end, FIG. 5A shows a voltage diagram illustrating the headroom between a single fixed supply rail and an example of the output voltage of a prior art Class AB power amplifier. By contrast, and with continued reference to FIGS. 1, 2A, 2B, 2C and 2D, FIGS. 5B and 5C show voltage diagrams illustrating the headroom between supply rails for respective first and second modes of operation corresponding to the on/off state of transistor Q7.

With specific reference to FIG. 5A, the supply voltage is 24V, while the peak output voltage for an average signal is about 6 volts. Consequently, the headroom between the supply voltage and the output is about 18V. As noted earlier, to make that extra voltage available but not used means wasting current to bias the necessary active devices, which in turn significantly reduces efficiency.

The voltage diagram shown in FIG. 5B illustrates an example of the headroom between the supply voltage and the output for the equivalent circuit shown in FIG. 2C in which $V_2/2$ is 8.8 V. With reference to FIG. 2C, the transistor Q7 is off, which means that the linear control circuit 201 is effectively separated from the voltage divider. Consequently, the rail-to-rail voltage between CD+ and CD− is $V_2$ (e.g. 8.8V× 2), which in turn means that the output of the amplifier circuit is constrained to $V_2$, until the transistor Q7 is turned on by way of the audio feedback signal to the linear control circuit 201. As shown in this example, the headroom between the supply voltage (of 8.8V) and the output voltage at its peaks is about 2.5 volts.

The voltage diagram shown in FIG. 5C illustrates an example of the headroom between the supply voltage and the output voltage for the equivalent circuit shown in FIG. 2D in which $V_1/2$ is 14V. With reference to FIG. 2D, the transistor Q7 is on, which means that the linear control circuit 201 is coupled to the voltage divider. Consequently, the rail-to-rail voltage between CD+ and CD− can be as high $V_1$ (e.g. 14V× 2). As shown in this example, the headroom between the supply voltage (of 14V) and the output voltage at its peaks is about 2 volts near the peak values. However, above the floor of 8.8V (the value of $V_2/2$), the supply rail is not fixed and is allowed to track the requirements of the output voltage. The tracking is provided by the linear control circuit 201, which is described in further detail below with reference to FIG. 3.

Moreover, the audio quality is improved because the transistor Q7 is operated in a linear mode, which is what allows the rail-to-rail voltage between CD+ and CD− to follow the audio signal accurately. The response is also relatively fast permitting the use of a large signal bandwidth (e.g. well over 20 KHz).

Figure 3:
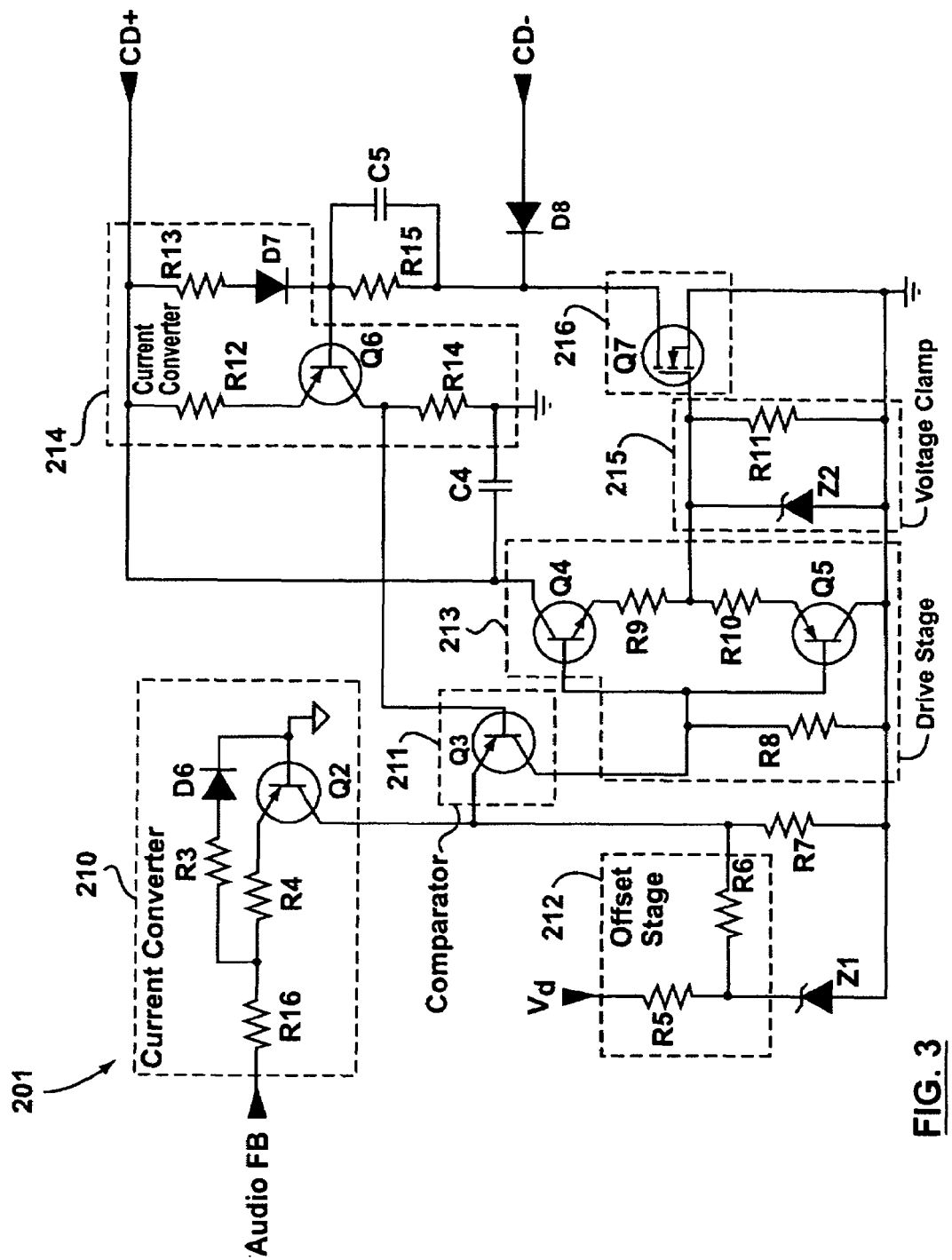
FIG. 3 is a circuit drawing of a linear control circuit shown in FIG. 2A and in accordance with an embodiment of the invention.

FIG. 3 is a detailed circuit drawing of a linear control circuit 201 shown in FIG. 2A. The purpose of the linear control circuit 201 is to have the voltage supply to the amplification circuit 103, provided by CD+ and CD−, track the changes in the input (and thus the expected output) audio signal. This is accomplished by comparing the audio input signal with an offset version of CD+. When there is a deviation and CD+ is greater than $V_2/2$, CD+ is changed so as to track the expected output voltage level of the amplification circuit 103 up to a rail-to-rail maximum of $V_1$. When CD+ is below $V_2/2$, $V_2$ is simply provided as the rail-to-rail voltage between the voltage rails CD+ and CD− by turning the transistor Q7 off and effectively separating the linear control circuit 201 from the voltage divider.

With specific reference to FIG. 3, the linear control circuit 201 includes a number of sub-circuits that together cooperate to perform the desired function described above with reference to FIGS. 5B and 5C. Starting with the input sub-circuits, the linear control circuit 201 includes an offset stage 212 and a first current converter 210. The first current converter 210 is provided to receive the audio feedback signal from the amplifier circuit 103 (in FIG. 1) and convert the voltage level to a current corresponding to the voltage level of the audio signal. The offset stage 212 is provided to prebias the transistor Q7 to a voltage level which will not provide power for the CD+ rail at low power demand, but will prebias the transistor Q7 to a level that will enable the transistor Q7 to be ready to provide a fast and large power output in real-time.

The voltage outputs of the first current converter 210 and the offset stage are summed at the emitter of bipolar junction transistor Q3 and then compared with the voltage at the base of Q3 which is developed by the feedback current converter 214. When there is no signal, the drain of the transistor Q7 has a voltage level that is set by the offset stage 212. When there is a small signal, the voltage at the drain of the transistor Q7 will follow, but is otherwise unable to supply voltage to the CD+, CD− rails, until the voltage across the diode D8 changes as described above. When the signal is large enough, the voltage across the diode DB will be sufficient to cause the diode D8 to conduct, thereby connecting the transistor Q7 to the voltage divider. The driving circuit in combination with the voltage clamp 215 turns on the transistor Q7 and biases the gate of the transistor Q7 so that the rail-to-rail voltage between CD+ and CD− is maintained at a level between $V_2$ and $V_1$ at a point somewhat offset above the expected amplifier audio signal output of the amplification circuit. Depending on the specific current and voltage requirements, it is expected that those skilled in the art will be able to appropriately select component values in the sub-circuits listed.

Figure 4:
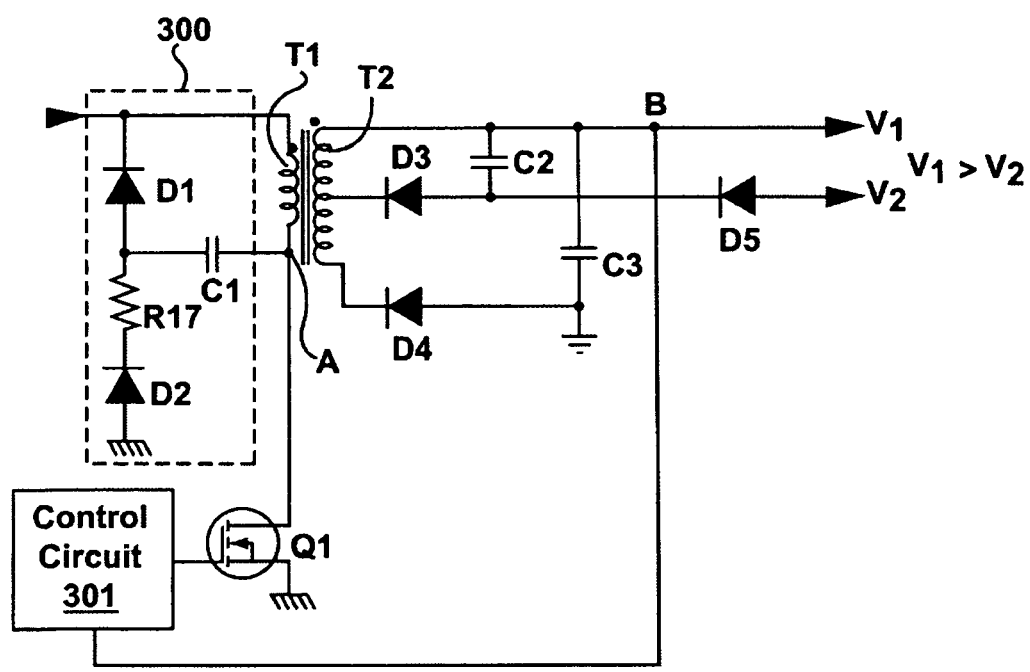
FIG. 4 is a simplified power supply circuit with an integrated snubber circuit in accordance with an embodiment of the invention.

As noted above, some embodiments of the power amplifier include a power supply circuit with a low power passive snubber circuit for dissipating Electromagnetic Interference (EMI) and reducing the voltage spike/peak across the switching device (in this example transistor Q1) due to the leakage inductance of the transformer. To that end, FIG. 4 is an illustration of a simplified power supply circuit 101 and a snubber circuit 300 in accordance with an embodiment of the invention. The power supply circuit 101 employs a flyback converter configuration and a passive low power snubber 300. The flyback converter configuration is suitable for low power applications.

The flyback converter of power supply circuit 101 includes a transformer having respective primary and secondary windings T1 and T2. The primary winding T1 is connected to a voltage supply (not shown) and combined with the passive low power snubber 300, hereinafter the snubber 300, provided in accordance with aspects of the invention. The snubber 300 includes a combination of two diodes D1 and D1, a capacitor C1 and resistor R17 connected as follows with specific reference to FIG. 4. The first diode D1 and the capacitor C1 are connected in series across the primary winding T1, with the capacitor connected to one end of the primary winding labeled terminal A in FIG. 4. One end of the resister R17 is connected at the node connecting D1 and C1 in series. The second diode D2 is between the other end of the resistor R1 and ground.

The secondary winding T2 of the power supply 101 is ultimately connected to the linear regulator as described above with reference to FIG. 2B. To reiterate briefly, with reference to FIG. 2B, the secondary winding T2 is center tapped. The center tap is coupled across the voltage rails CD+ and CD− and a parallel capacitor C2 is also included across the voltage rails CD+ and CD−. A diode D3 is connected between one end of the capacitor C2 and the center tap of the transformer winding T2. The end terminals of the transformer winding T2 are connected across the voltage rail CD+ and ground, and a parallel capacitor C3 is included across the end terminals of the transformer winding T2. A diode D4 is connected in series between one end of the transformer winding T2 and the ground connection.

The power supply also includes a control circuit 301 and a transistor Q1. The control circuit 301 is connected to terminal A on the primary side of the transformer via the transistor Q1.

The control circuit 301 is also connected to sense the voltage at a terminal B on the secondary side of the power supply 101. In operation, the control circuit 301 senses the voltage at terminal B and sets the voltage at terminal A so that the voltage at terminal A is held to a constant value. In other words, the control circuit 301 does not allow voltage fluctuations on the secondary side of the transformer to significantly change the voltage on the primary side of the transformer. As a result the snubber 300 can be provided alone and is sufficient alone to dissipate EMI within the power supply.

More specifically, the low power passive snubber 300 is designed to affect peak voltages and eliminate the ringing due to the leakage inductance of the transformer and the transistor Q1 switching on and off rapidly.

The snubber 300 is different from conventional RC and RCD snubbers because the capacitor C1 is charged to a voltage that is dependent on the transformer turns ratio in the flyback converter circuit and the output voltage of the flyback converter circuit. The outputs of the flyback converter circuit are the output voltage rails $V_1$ and $V_2$ of the power supply in general, which are held constant. The result of holding the output voltage rails $V_1$ and $V_2$ at constant values is that the transformer turns ratio can be fixed, thereby allowing the charge on the capacitor C1 to remain fixed. The discharge path of the capacitor C1 is through the resistor R1 to ground. Consequently, there are approximately constant power losses in the resistor R17 that are independent of the supply voltage.

Moreover, because the snubber 300 has lower power loss compared to the traditional snubber circuits, it presents an opportunity to use a lower cost transformer with simplified winding construction (primary-shield-secondary), while increasing the power dissipated in the power resistor. This also reduces the parasitic capacitance between primary-secondary winding T1/T2, thereby improving EMI.

While the above description provides example embodiments, it will be appreciated that the present invention is susceptible to modification and change without departing from the fair meaning and scope of the accompanying claims. Accordingly, what has been described is merely illustrative of the application of aspects of embodiments of the invention and numerous modifications and variations of the present invention are possible in light of the above teachings.

For instance, the power supply can be modified to provide more than two supply voltages, and the linear control circuit can be modified to track the power requirements of the output audio signal when in between different supply voltages.

The invention claimed is:

1. A power amplifier comprising:
an amplification circuit for amplifying an input signal to produce an output signal and providing a feedback signal for tracking the expected power requirements of the output signal; and
a linear regulator, connectable for receiving as inputs the feedback signal from the amplification circuit and a plurality of fixed voltage supply rails and providing as an output at least one voltage supply to the amplification circuit, wherein in at least one mode of operation the at least one voltage supply provided to the amplification circuit tracks the expected output requirements of the amplification circuit between two of the plurality of fixed voltage supply rails.

2. The power amplifier as claimed in claim 1, further comprising a multi-level power supply for providing the plurality of fixed voltage supply rails to the linear regulator.

3. The power amplifier as claimed in claim 1, wherein the linear regulator comprises:
positive and negative voltage rails;
a voltage divider across the positive and negative voltage rails including two resistors R1 and R2 connected at a ground potential;
a linear control circuit for tracking the expected output requirements of the amplification circuit between two of the plurality of fixed voltage supply rails; and
a coupler connected between the linear control circuit and the voltage divider for selectively coupling the linear control circuit to the voltage divider.

4. The power amplifier as claimed in claim 3, wherein the coupler includes the combination of a transistor and a diode connected between the linear control circuit and the voltage divider, with the anode of the diode connected to the voltage divider.

5. The power amplifier as claimed in claim 4, wherein in a first mode of operation the coupler is configured to operate as an open circuit, and in a second mode of operation the coupler is configured to operate as a tunable resistor.

6. The power amplifier as claimed in claim 3, wherein the positive voltage rail is connectable directly to a terminal of a multi-level power supply that provides at least some of the plurality of fixed voltage supply rails.

7. The power amplifier as claimed in claim 3, wherein the linear control circuit is connectable to receive as inputs the feedback signal from the amplification circuit and the level of the at least one voltage supply provided by the linear regulator to the amplification circuit.

8. The power amplifier as claimed in claim 7, wherein the linear control circuit comprises:
a transistor connectable to the voltage divider of the linear regulator;
an offset stage for prebiasing the transistor to an on state without the transistor being coupled to the voltage divider; and
a comparator for summing respective currents derived from the feedback signal and the level of the at least one voltage supply rail of the amplification circuit and comparing the respective voltages of each and adjusting the bias on the transistor in response to fluctuations in the feedback signal and the level of the at least one voltage supply rail.

9. The power amplifier as claimed in claim 8, wherein the comparator is configured to bias the transistor to provide additional supply voltage to the amplification circuit when the expected power requirements for the output signal is above the magnitude of a first voltage supply rail and below the magnitude of a second voltage supply rail.

10. The power amplifier as claimed in claim 9, wherein the comparator is configured to bias the transistor to not provide additional supply voltage to the amplification circuit when the expected power requirements for the output signal is below the magnitude of the first voltage supply rail.

11. The power amplifier as claimed in claim 8, wherein the linear control circuit further comprises:
a first current converter connected to the comparator, the first current converter being configured to receive the feedback signal and provide a corresponding first current signal to the comparator;
a second current converter connected to the comparator, the second current converter being configured to receive one of the at least one voltage supply rail from the amplification circuit and provide a corresponding second current signal to the comparator; and
a drive stage connected to the comparator and the transistor, the drive stage being configured to receive the output of the comparator to bias the transistor.

12. The power amplifier as claimed in claim 11, wherein the linear control circuit further comprises a voltage clamp connected between the output of the drive stage and the input of the transistor, the voltage clamp being configured to limit the amount of bias of the transistor.

13. The power amplifier as claimed in claim 2, wherein the power supply comprises:
- a transformer including primary and secondary windings;
- a control circuit coupled to respective points on both the primary and secondary windings, the control circuit being operable to maintain a fixed voltage level on the primary winding irrespective of voltage level changes on the secondary winding; and
- a snubber circuit connected to the primary winding of the transformer, the snubber circuit including a combination of first and second diodes, a capacitor and a resistor, wherein the first diode and the capacitor are connected in series across the primary winding, with the capacitor connected to one end of the primary winding, and one end of the resister is connected at a node connecting the diode and the capacitor in series, and the second diode is connected between the other end of the resistor and ground, wherein the discharge path of the capacitor is through the resistor to ground.

14. The power amplifier as claimed in claim 13, wherein the power supply further comprises a transistor connected between the control circuit and the one end of the primary winding connected to the capacitor.

15. The power amplifier as claimed in claim 13, wherein the power supply further is arranged in a flyback configuration.

16. The power amplifier as claimed in claim 14, wherein the power supply further comprises:
- a second capacitor and a third diode connected in series between a first terminal of the secondary winding and a center tap of the secondary winding with the cathode of the third diode being connected to the center tap;
- a third capacitor and a fourth diode connected in series between the first terminal of the secondary winding and a second terminal of the secondary winding with the cathode of the fourth diode being connected to the second terminal; and
- a fifth diode having a cathode connected to the anode of the third diode,
- wherein the power supply provides a first voltage supply rail connectable to the first terminal of the secondary winding, and a second voltage supply rail connectable at the anode of the fifth diode.

17. A method of adjusting supply voltages provided to an amplification circuit of a power amplifier based on a plurality of fixed supply voltage rails, wherein the method comprises:
- generating a feedback signal indicative of the expected power requirements of an output signal produced by the power amplifier;
- comparing the feedback signal to at least one of the plurality of fixed supply voltage rails; and
- adjusting the supply voltages to track the expected power requirements of the output signal in a first mode of operation when the expected power requirements of the output signal is between two of the plurality of fixed supply voltage rails.

18. The method of claim 17, wherein the method further comprises generating the supply voltages to be at the level of the lower of the two of the plurality of fixed supply voltage rails in a second mode of operation when the expected power requirements of the output signal is less than the lower of the two of the plurality of fixed supply voltage rails.

19. A power amplifier comprising:
- an amplification circuit for amplifying an input signal to produce an output signal and providing a feedback signal for tracking the expected power requirements of the output signal;
- means for comparing the feedback signal to at least one of a plurality of fixed supply voltage rails; and
- means for adjusting the supply voltages provided to the amplification circuit to track the expected power requirements of the output signal in a first mode of operation when the expected power requirements of the output signal is between two of the plurality of fixed supply voltage rails.

* * * * *